United States Patent
Richart et al.

(10) Patent No.: US 11,095,306 B2
(45) Date of Patent: Aug. 17, 2021

(54) METHOD AND SYSTEM FOR DETERMINING A SAMPLING SCHEME FOR SENSOR DATA

(71) Applicant: Teraki GmbH, Berlin (DE)

(72) Inventors: Daniel Lampert Richart, Berlin (DE); Markus Kopf, Berlin (DE)

(73) Assignee: Teraki GmbH, Berlin (DE)

( * ) Notice: Subject to any disclaimer, the term of this patent is extended or adjusted under 35 U.S.C. 154(b) by 638 days.

(21) Appl. No.: 16/065,306

(22) PCT Filed: Dec. 30, 2015

(86) PCT No.: PCT/EP2015/081451
§ 371 (c)(1),
(2) Date: Jun. 22, 2018

(87) PCT Pub. No.: WO2017/114578
PCT Pub. Date: Jul. 6, 2017

(65) Prior Publication Data
US 2021/0167794 A1    Jun. 3, 2021

(51) Int. Cl.
*H03M 7/30*    (2006.01)

(52) U.S. Cl.
CPC ............ *H03M 7/60* (2013.01); *H03M 7/3062* (2013.01)

(58) Field of Classification Search
CPC ... H04W 4/70; H04W 52/0203; H04W 84/18; H04L 67/12; H04L 41/145; H04L 43/024; H03M 7/3062; H03M 7/60
(Continued)

(56) References Cited

U.S. PATENT DOCUMENTS

| 8,280,671 | B2* | 10/2012 | Luo | ................. | G06F 15/16 |
| | | | | | 702/118 |
| 8,693,597 | B2* | 4/2014 | Sexton | ................ | H03M 1/129 |
| | | | | | 375/346 |

(Continued)

FOREIGN PATENT DOCUMENTS

EP    2369748 A1    9/2011

OTHER PUBLICATIONS

International Search Report for PCT/EP2015/081451 dated Sep. 20, 2016; 2 pages.
(Continued)

*Primary Examiner* — Khai M Nguyen
(74) *Attorney, Agent, or Firm* — Fletcher Yoder, P.C.

(57) ABSTRACT

A device and computer-executable method is provided for adaptively determining a sampling scheme to be applied at a first sensor from among a plurality of sensors for sampling sensor data values corresponding to a signal. A sparsifying transform for a subsequent sampling time window of the first sensor is predicted, wherein the sparsifying transform is determined based on a predictive model of the sparsity of the signal. Moreover, a subsampling parameter for the subsequent sampling time window is determined. The subsampling parameter corresponds to a number of sensor data values to be acquired within the sampling time window. This subsampling parameter is determined based on the predicted sparsifying transform. Further determined is a compressive sampling scheme for the subsequent sampling time window of the first sensor. The compressive sampling scheme is determined based on the predicted sparsifying transform.

15 Claims, 8 Drawing Sheets

(58) Field of Classification Search
USPC .......................................................... 702/188
See application file for complete search history.

(56) References Cited

U.S. PATENT DOCUMENTS

2011/0066381 A1   3/2011  Garudadri et al.
2015/0178944 A1   6/2015  Haimi-Cohen et al.
2015/0334580 A1  11/2015  Niskanen et al.

OTHER PUBLICATIONS

Communication pursuant to Article 94(3) EPC for Application No. 15817430.0 dated May 29, 2019, 5 pages.

* cited by examiner

METHOD AND SYSTEM FOR DETERMINING A SAMPLING SCHEME FOR SENSOR DATA

CROSS-REFERENCE TO RELATED APPLICATIONS

This application is a national stage of PCT Application No. PCT/EP2015/081451, entitled "METHOD AND SYSTEM FOR DETERMINING A SAMPLING SCHEME FOR SENSOR DATA", filed on Dec. 30, 2015, which is hereby incorporated by reference in its entirety.

BACKGROUND

The present invention relates to the sampling of signals by a plurality of sensors and the respective transmission of the sampled data to a gateway or to one or more servers or cloud services. The efficient transmission and processing of such sampled data in a remote network or cloud service becomes increasingly critical with the increase of sensor data to be sampled or processed. For example, smart cities operate large sensor networks which enable the users to benefit from a variety of smart applications based on environment data and large amounts of data that is sensed and processed. Likewise, production facilities often utilize large sensor networks as in machine to machine (M2M) applications and generate numerous real-time sensor data for monitoring, e.g., a production chain. All kinds of vehicles, such as watercraft, aircraft or road vehicles are also provided with more and more sensors, thus creating a need to appropriately acquire and analyze the sensor data.

The generation of the vast amount of data comes with a need to efficiently transmit, process, analyze and store the sensor data. Today's sensor networks produce high network traffic both at a data transmitting sensor and a corresponding receiver. These requirements impose physical limits to the size, density, availability and latency characteristics of any sensor network. Likewise, the known sensor networks waste valuable network resources by transmitting redundant sensor data which will be compressed in a subsequent processing step. Conventional compression methods come with a high cost of resource consumption when compressing sensor data either before transmission or after a reception at a cloud storage or gateway. Furthermore, conventional compression methods add an additional delay into the processing chain of the sensor data which impedes time critical applications. In addition, these compression methods lock away the valuable sensor data in a manner complicating advanced data analysis or simple queries, since the compressed data conceals the otherwise meaningful information apparent in the uncompressed sensor data.

While the compressive sampling framework (also known as compressed sensing, compressive sensing, sparse sampling) provides valuable approaches to overcome some drawbacks of conventional compression methods, it also imposes new difficulties in the application of sensor networks, specifically the data transmission, data reconstruction and data analysis.

SUMMARY

An embodiment of the present invention provides an improved gateway and/or server for receiving, storing or processing sensor data from of plurality of sensors in a system of sensors. Further embodiments concern a corresponding system, a corresponding method and a corresponding computer-readable medium with computer-executable instructions, that when executed by a processor or computer, cause the processor or computer to perform a corresponding method.

A computer-executable method for adaptively updating a sampling scheme of a sensor or gateway is proposed. A majority of the computational resources of an adaptive/data sampling scheme may be placed to a server environment. This scheme may be described as a predictive compressive principal component model: Its predictive model may allow identifying and/or determining an optimal sparsifying transform which is suitable to sparsify data acquired at subsequent time windows (also referred to as sampling period or sampling time window). It may further allow adapting a sub-Nyquist sampling scheme and a subsampling parameter M to that optimal sparsifying transform. The method may place most computationally intensive tasks at a server, and may even avoid a synchronization of the sparsifying transform between a gateway and the server. By that, significant improvements can be achieved in terms of bandwidth requirements and local computation and memory resources while implementing an adaptive scheme.

The method may further encompass a sampling scheme at a gateway or sensor enabling to place a frequency decomposition and sparsifying transformation separately into the server. In addition, a multiplexed data acquisition at the gateway and sensor side may be performed. Further on, the method may define suitable modeling parameters in the server, with a lightweight implementation of a model on the gateway, thus, allowing a prediction of frequency patterns and/or changes in the data itself on the gateway, and allowing triggering an alarm to these events either at the gateway or server.

The method may allow using a predicted sparsity from an adaptive filtering step as an input parameter for a sparsifying transform update scheme. As a result of the sparsifying transform update scheme, a sparsifying transform may be computed which may be used at subsequent Nyquist and sub-Nyquist sampling time windows. Further on, the same sparsifying transform may be used to initiate a subsampling adaptation scheme. The subsampling adaption scheme may be used for updating a reduction rate. In all these steps the synchronization of the entire sparsifying transform, or at least most modelling coefficients for that sparsifying transform, between a gateway and a server may be omitted.

According to an embodiment sensor data of a first sensor and a second sensor may be received. The sensor data of each sensor may include one or more sensor values (also referred to as "sensor data values"), respectively. Each sensor may use a compressive sampling scheme (which may also be denoted as compressive sensing scheme) to transmit its sensor values. In other words, each sensor value from a specific sensor may be received at a reception instant corresponding to a sampling instant of the sensor value. A first compressive sampling scheme for the first sensor and a second compressive sampling scheme for the second sensor each may define a plurality of sampling instants within a common sampling period of the first and the second sensors, respectively. Each sampling instant of the first compressive sampling scheme may be non-overlapping to each sampling instant of the second compressive sampling scheme. In other words, each sampling instant of the first compressive sampling scheme may complement each sampling instant of the second compressive sampling scheme. The first compressive sampling scheme may correspond to a transmission scheme of the sensor data or sensor values of the first sensor. The same may hold for the second sensor and the second compressive sampling scheme. Likewise, the first compressive sampling scheme may correspond to a reception scheme/pattern of the sensor data or sensor values at a gateway. A sensor value received among the sensor data of the first sensor may correspond to a particular sampling instant from among of the plurality of sampling instants defined in the first compressive sampling scheme.

The sensor data or sensor values may be received over a communication protocol on top of an application layer, such as MQTT, CoAP or the like. The first compressive sampling scheme may be updated based on the received sensor data or sensor values of the first sensor. The updated compressive sampling scheme may be determined from sensor values or data sampled according to a Nyquist sampling scheme.

Updating the first compressive sampling scheme may be based on a noise level associated with the first sensor. The noise level may be determined from the sensor data or values sampled according to the Nyquist sampling scheme.

According to an embodiment, a sparsity for a subsequent sampling period of the first sensor may be determined or predicted. The determined/predicted sparsity may be based on received sensor data or values from a previous sampling period. The first compressive sampling scheme may then be updated based on the predicted sparsity for the first sensor. For example, a subsampling parameter of the first compressive sampling scheme may be adapted.

According to an embodiment, a critical signal condition associated with the first sensor may be determined from the received sensor value. Such critical signal condition may be determined if the received sensor value surpasses a threshold and the critical signal condition may be triggered upon arrival of each of the subsampled data points (sensor values), even before performing a reconstruction of the signal within a time window.

According to an embodiment, a critical signal condition associated with the first sensor may also be determined based on an approximation of a frequency decomposition of a signal at the first sensor. Said approximation may be based on the sparsity and a sparsifying matrix constructed and adapted from Nyquist sampled data points (i.e. sensor data sampled according to a Nyquist sampling scheme) from a previous time window. Said approximation may be adapted to the concrete dynamics of the underlying data (i.e., the signal at the sensor) by making use of suitable PCA (Principal Component Analysis) kind adaptation methods. If the approximated frequency decomposition from the received sensor values is in agreement with a predetermined frequency decomposition or differs from a previously measured frequency decomposition more than a given threshold, then the critical signal condition may be detected. Additionally, the critical event detection may be used to trigger an adaptation of the sparsifying transform.

BRIEF SUMMARY OF THE FIGURES

These and further aspects and features of the present invention will be described by the following detailed description of the embodiments of the invention under reference to the accompanying drawings, wherein.

DETAILED DESCRIPTION

Figure 1:
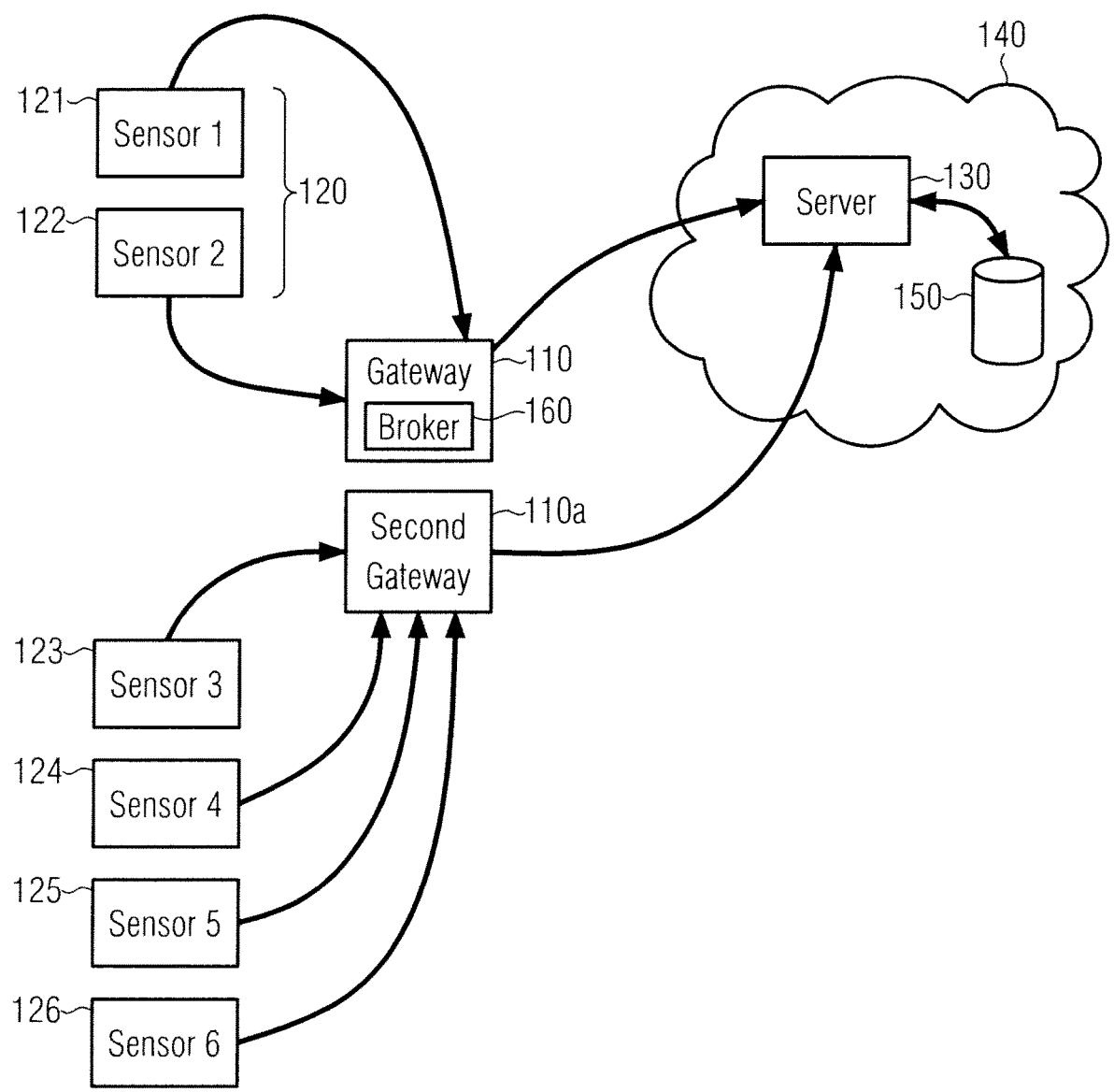
FIG. 1 is a block diagram illustrating a system of sensors, a gateway, a server, and a cloud environment.

Reference will now be made in detail to the exemplary embodiments, examples of which are illustrated in the accompanying drawings, wherein like reference numerals refer to like elements throughout.

FIG. 1 illustrates a system 100 providing a gateway 110 and a plurality of sensors 120. The gateway 110 may further comprise a message broker 160. The message broker 160 may be used to enable message-based communication between the gateway 110 and the plurality of sensors 120. In an exemplary embodiment, the message broker 160 may be implemented as an MQTT broker. A sensor, such as sensor 121 to 126, may include a message passing client, such as an MQTT client. The system 100 may further comprise a second gateway 110a, which may provide the same functionality as gateway 110. According to an embodiment, each sensor 121 to 126 may be any kind of sensor in an environment monitoring system, such as in smart cities, in means of transportation, such as an airplane, an automotive vehicle, a nautical vehicle, or automated machines, such as in production facilities. In addition, the sensors 121 to 126 may be operated independently from each other. For example, it is contemplated that the sensor 121 may not share common hardware (such as an ADC) with another sensor 122. Further, the sensors may be located at separate locations, may acquire different kinds of signals or data. The sensors 121 to 126 may be implemented as sensor nodes.

According to an embodiment, the gateway 110 may receive sensor data from each sensor 121 to 126, respectively, wherein the sensor data may encompass one or more sensor values. In an exemplary embodiment, the second gateway 110a may receive sensor data from sensors 123 to 126 and the gateway 110 may receive the sensor data from the sensors 121 and 122. In this example, the gateway 110 may receive the sensor data of the sensors 123 to 126 from the second gateway 110a.

The system 100 may further comprise a server 130, a cloud environment 140 or a database 150. The server 130 may be running in the cloud environment 140 or on premise. The database 150 may be included in the server 130 or in the cloud environment 140. The server 130 and/or cloud environment 140 may also include a message broker 160. The database 150 may be used to store the sensor data from each sensor 121 to 126.

According to an embodiment, the server 130 may receive sensor data from the sensor 121 directly. According to another embodiment, the server 130 may receive sensor data from the sensor 121 over the gateway 110. According to another embodiment, the server 130 may receive sensor data from the sensor 121 from a message broker 160, wherein the broker 160 is operated by the gateway 110, the server 130, the cloud environment 140, or one or more clients in the gateway 110. The gateway 110, server 130 or cloud environment 140 may analyze the received sensor data.

According to an embodiment, the sensor 121 may sample a signal in conformance with the Nyquist sampling criterion (also denoted as Nyquist sampling scheme throughout the entire application). Likewise, the sensor 121 may also sample the signal in conformance with the Compressive Sampling Theory (also denoted as compressive sampling scheme or sub-Nyquist sampling scheme throughout the entire application). In the second case (i.e. compressive sampling scheme), fewer sensor values may be required to sample in order to reconstruct the signal.

According to an embodiment, the sensor 121 may acquire a sensor value within a sampling period and may immediately transmit the sensor value to the gateway 110. In this example, the gateway 110 may immediately process the received sensor value (and benefits from the reduced latency between the sensor value acquisition and processing). Likewise, the sensor 121 may wait until all sensor values within the sampling period have been acquired and then transmit all sensor values to the gateway 110.

According to an embodiment, the gateway 110 may receive the sensor data from the sensor 121 (embedded) through an application layer of a possible communication protocol. Suitable application layers may be MQTT, CoAP, HTTP, HTTPS or WebDAV.

According to an embodiment, the gateway 110 may share a resource with the plurality of sensors 120. For example, this resource may be a common reception interval, period or buffer which may correspond to a common sampling period of two or more of sensors 121 to 126. Likewise, the gateway 110 may receive the sensor data from the sensors 120 over a shared resource, such as a common (network) interface, channel, protocol, bus, or I/O device.

According to an embodiment, the sensor 121 may utilize a Nyquist sampling scheme and a compressive sampling scheme in an alternating manner. The gateway 110 may then receive in a first reception period sensor data sampled according to the Nyquist sampling scheme, and in a second reception period sensor data sampled according to the compressive sampling scheme. The Nyquist sampled sensor data may be used to adapt the compressive sampling scheme.

According to an embodiment, the sensor 121 and the sensor 122 both acquire their respective sensor data according to compressive sampling schemes. For example, the sensor 121 acquires each sensor value according to a first compressive sampling scheme, and the sensor 122 request each sensor value according to a second compressive sampling scheme. Following this example, the sensor 121 may also immediately transmit to the gateway 110 or publish to the message broker 160 each acquired sensor value according to the first compressive sampling scheme. Likewise, the sensor 122 may transmit or publish each of its acquired sensor values according to the second compressive sampling scheme. According to an embodiment, the sensor 121 and sensor 122 may share a common sampling period (or a common reception period from the view of the gateway 110). For sparse signals, such as a constant signal, a periodic signal composed of a few frequency components, etc., sampling techniques based on compressive sampling are beneficial to reduce the number of samples N to a much smaller number M, while still being able to recover the original signal from a reduced number of sampled data, or at least extract valuable information about the frequency decomposition of the original signal. Within a compressive sampling period the number of sensor values M needed for reconstructing a signal available to the sensor 121 may be lower than the number of sensor values N within a corresponding Nyquist sampling period. In such case, the sensor 122 may acquire its sensor values according to a second compressive sampling scheme with a number of (N–M) sensor values, wherein the sensor values may be acquired at complementary sampling instants within the common sampling period. Such resource sharing may allow the gateway 110 to receive sensor data from multiple sensors 120 in the common sampling period (respectively reception period), for example, when the sensor 121, respectively sensor 122 immediately transmit each of their respective sensor value as acquired according to their respective compressive sampling scheme. In an exemplary embodiment, the sensor 121 and sensor 122 may need N sensor values when acquiring their respective sensor data according to a Nyquist sampling scheme. Following this example, the sensor 121 and the sensor 122 may need to transmit only N/2 sensor values when each use their respective compressive sampling scheme which may allow them to share the common sampling period, respectively reception period of the gateway 110. This time interval (common sampling period) may be relevant for the reconstruction of the final signals in the server 140, but the described sampling scheme may allow retrieving the data points (sensor values) at corresponding subsampled time periods even before the reconstruction.

Figure 2:
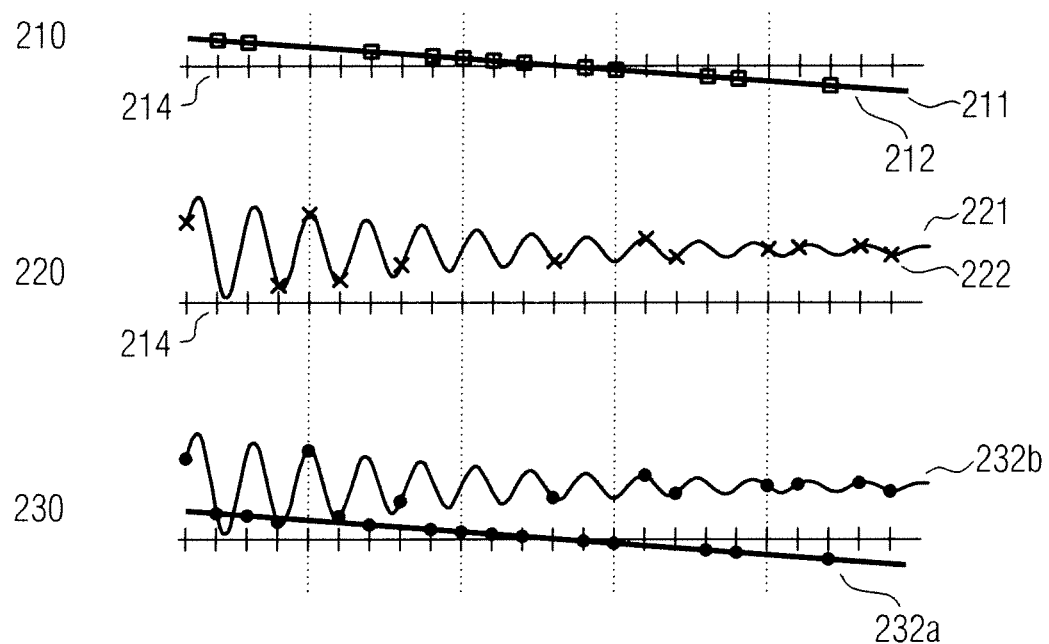
FIG. 2 illustrates timing diagrams for sampling, transmitting and receiving sensor values.

FIG. 2 illustrates timing diagrams of sampled sensor data of the sensor 121 and sensor 122 within a common sampling period 213, and the gateway 110 receiving the sampled sensor data. Timing chart 210 illustrates the data sampling and transmission scheme for sensor 121. Timing chart 220 illustrates the sampling and transmission scheme of the sensor 122. Timing chart 230 illustrates the reception scheme of gateway 110. According to an embodiment, the gateway 110 may receive the sampled data from each sensor, e.g., sensor 121 or 122, with a specific sampling clock that may be synchronized to the sampling clock of each sensor.

Sensor 121 may sample a signal 211, such as the signal of a turning wheel or a displacement sensor, as illustrated in timing diagram 210. Likewise, sensor 122 may sample a signal 221 as illustrated in timing diagram 220. On the abscissa of timing diagram 210 and 220 each possible sampling instant 214 according to a Nyquist sampling scheme is illustrated. On the abscissa of timing diagram 230 each possible reception instant for the gateway 110 is illustrated.

A compressive sampling scheme of the sensor 121 is illustrated by the square symbols which show each sampled (and transmitted) sensor value 212 of the signal 211. Another compressive sampling scheme of the sensor 122 is illustrated by the "x" symbols which show each sampled (and transmitted) sensor value 222 of the signal 221. The filled circle symbols in timing diagram 230 illustrate the received sensor values from the sensors 121 and 122. Received sensor value 232a corresponds to the sensor value 212. Received sensor value 232b corresponds to sensor value 222. Each sensor 121 and 122 may use its respective compressive sampling scheme also as a transmission scheme such that the gateway 110 may receive each sensor value 232 of the sensors 121 and 122 according to the order defined by the respective compressive sampling schemes.

A compressive sampling scheme may be further defined by a subsampling parameter M. Said subsampling parameter may define the number of samples to acquire within a sampling period, such as sampling period 213. The subsampling parameter may be based on the sparsity of a signal 211. Further, the subsampling parameter may be based on a sparsifying transform (or matrix) associated with the compressive sampling scheme.

When the sensor 121 is employing a compressive sampling scheme the gateway 110 may not receive a sensor value at every possible reception instant of the common sampling period 213. In order to increase the reception efficiency of the gateway 110, multiple sensors 120 may simultaneously employ a compressive sampling scheme in the same/common sampling period 213 and the gateway 110 may receive within the common sampling period 213 sensor values from all sensors sharing the common sampling period.

In the following a multiplexing reception scheme of the gateway 110 based on compressive sampling schemes of two sensors 121 and 122 is explained. k1 may be the sparsity of the original signal 211 being sensed by sensor 121, and k2 may be the sparsity of the original signal 221 being sensed by sensor 122. Then, M1 and M2 may be the subsampling parameters (corresponding to reduced number of samples to make at each sensor 121 and 122, respectively) of sensor 121 and 122, respectively, while maintaining the ability to recover each original signal 211 and 221 from the reduced number of sensor values. If the total sum of the subsampling parameters M1+M2 is lower than N (here N may denote the number of samples according to a Nyquist sampling scheme in the common sampling period), then for each sensor 121 and 122 a respective compressive sampling scheme may be defined. For example, the two compressive sampling schemes may be defined by choosing a number of M1 sampling instants from N possible sampling instants for a first compressive sampling scheme. For a second compressive sampling scheme a number of M2 sampling instants may be selected such that these M2 sampling instants complement the M1 sampling instants of the first compressive sampling scheme. The sparser the signals associated with a sensor are, the more sensors may share a common sampling period with each other. Further on, as the compressive measurement matrices for each sensor should fulfill the RIP (Restricted Isometry Property) condition, this, according to an embodiment of the invention, may be warranted by a randomization of the columns of the measurement matrices. This implies that the subsampling parameters have to ideally fulfill M1+M2<<N. In this case a high reconstruction fidelity is warranted.

According to an embodiment, the gateway 110 or server 130 may be aware of each of the compressive sampling scheme which each sensor 121 to 126 may use for sampling and transmitting each of its sensor value. Likewise, the gateway 110 may be aware of a mapping between a sensor and each received sensor value. For example, the gateway 110 may keep a list indicating which received sensor value is associated to a particular sensor. According to another embodiment, the gateway 110 may generate a mapping between a sensor 121 and each received sensor value 232. For example, the gateway 110 may receive an identifier of a sensor 121 along with a sensor value 232.

According to an embodiment, the gateway 110 and the sensors 120 may receive information about the mapping between a compressive sampling scheme to a sensor 121, e.g., from the server 130.

According to an embodiment, the gateway 110 may be aware of the sparsity of each sensor's signal 211 and 222 and may generate compressive sampling schemes for each sensor, respectively. In these compressive sampling schemes the subsampling parameter M may be adapted for each sensor individually, e.g. based on a known sparsity of a signal which each sensor is sensing, respectively. The sparsity for a sensor 121 may be determined from a model of the signal, a correlation with other sensor values of other sensors, or by measuring the signal according to a Nyquist sampling scheme. Such model may be a sparsity model of the signal or a spatial correlation model of the signal with other sensors. The model generation may be performed in the server 130 and may use current data processing schemes such as PCA.

According to an embodiment, each sensor may transmit their respective sensor values according to a Nyquist sampling scheme to the gateway 110 and the gateway 110 may then selectively receive sensor values from each sensor according to compressive sampling schemes for each sensor. Thus, the gateway 110 may apply a compressive sampling scheme to the received data of each sensor; shifting the compressive sampling step from the sensors 120 to the gateway 110. According to another embodiment, the gateway 110 does not apply a sparsifying transform. Instead only a retrieval of single data points (sensor values) from a sensor 121 or gateway 110 may be required.

According to another embodiment, each sensor 120 may sample its signal according to a Nyquist or sub-Nyquist sampling scheme and may then buffer its sampled data in a batch storage (such as flash or ROM storage on the sensor device). In the former case the gateway 110 may indicate to the respective sensor, e.g. sensor 121, how to selectively reduce the number of sampled data in the batch storage according to a compressive sampling scheme before transmitting the reduced sampled data. Further, each sensor 120 may transmit its sampled data in a batch transmission to the gateway 110. For example, instead of transmitting each sampled data one by one, a set of sensor values may be transmitted to the gateway 110 and received by the gateway 110 at once. According to an embodiment, the gateway 110 receives the batched sampled data in parallel or in series from each sensor 121 to 126.

Encryption and Authentication

When one or more multiplexed compressively sampled signals may be transferred from the gateway 110 to the server 130, an eavesdropper may listen in the sensor values. However, without each compressive sampling scheme that corresponds to each compressively sampled signal, the eavesdropper may not gain any insight into the eavesdropped sensor values. The set of sensor values may appear as a stream of random noise to him. A compressive sampling scheme or a set of compressive sampling schemes may thus serve as an encryption key respectively, decryption key. According to an embodiment, the received sensor values of a compressively sampled signal may be stored in a given order in the message database, wherein the given order correspond to a set of M indices included in a corresponding compressive sampling scheme applied for generating the compressively sampled signal. The set of M indices may further correspond to sampling time instants within a sampling time window and may be generated according to the following procedure: The set of M indices may be selected as a subset from a set of randomly permuted indices from 1 to N, wherein N may denote the length/size of the sampling time window. M may denote the subsampling parameter M which may be associated with the sparsity of a signal being sampled by a corresponding sensor.

A database 150 for storing compressive sampling schemes may enable to implement an additional application layer data encryption scheme. The content of the database 150 may be created with a random number generator, either in the gateway 110 or server 130. The compressive sampling schemes may be replicated between the server 130 and the gateway 110 or a sensor 121, such that at least a one-time transmission between the gateway 110 and the server 130 may be performed at the beginning of a sampling time window. The number of entries in the compressive sampling scheme may depend on the subsampling parameter M selected for the sampling time window. As such a variable key-length encryption scheme may be deployed, wherein each compressive sampling key corresponds to a variable-length key. A mismatch between two randomly generated variable length keys increases with the key length. A security protocol may be implemented as follows:

The protocol may be started by comparing specific sampling time instants (time stamps) of sensor values. The sampling time stamps between the server 130 and entries of a sensor 121 or gateway 110 may overlap within a given specific time interval, corresponding to a minimal success threshold. If each of the time stamps from the sensor 121 or gateway 130 overlaps within the specified time interval, then a pass (such as a success for authentication) may be registered and the sensor 121 or gateway 110 may proceed with the data acquisition. If no overlap within the given specified time interval is determined, then a fail may be registered. In this case, received sensor values may be discarded and a new random compressive sampling scheme may be generated in the gateway 110 and transmitted to an end device (such as a sensor).

According to another embodiment, the compressive sampling schemes of each sensor may be used as key for an encryption scheme when forwarding the sensor values to the server 130 from the gateway 110.

According to another embodiment, the sensor 121 may combine its compressive sampling scheme with a delta-type encoding. The sensor 121 may then only send sensor values to the gateway 110 when the actual acquired sensor value is different than the previously acquired sensor value. In such transmission scheme, the power consumption of a sensor 121 may be even further reduced. The gateway 110 when being aware of the combined delta-type encoding with the compressive sampling scheme, may determine the actual sensor value to be identical to the previous sensor value received from the sensor 121. The delta-type encoding may also be combined with a Nyquist sampling scheme.

Figure 3A:
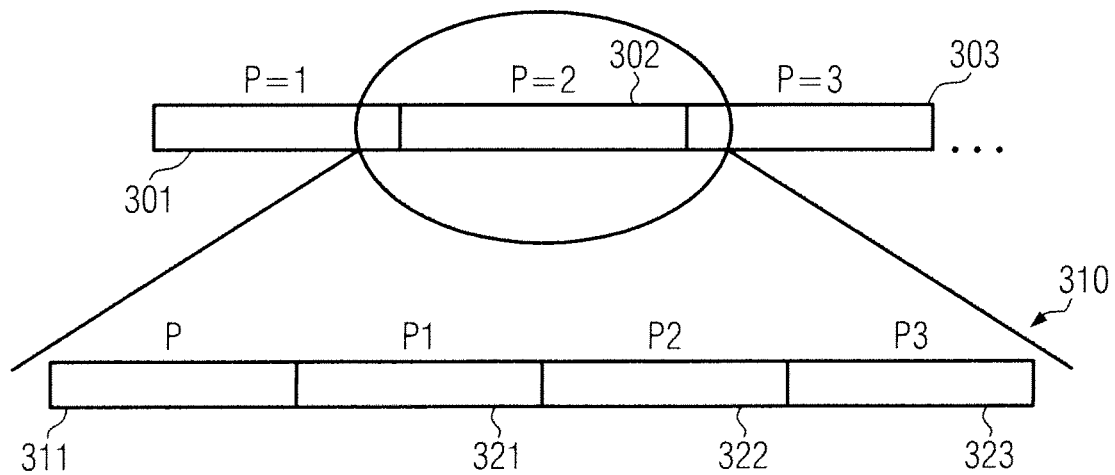
FIG. 3A is a block diagram illustrating a division of sampling periods between a Nyquist sampling and sub-Nyquist sampling period for a sensor.

FIG. 3A illustrates in a block diagram how sampling periods may be divided according to Nyquist sampling and sub-Nyquist sampling periods for a specific sensor, such as sensor 121. A composited sampling interval 301 may denote a sequence of multiple sampling periods. The composited sampling interval 301 may comprise a Nyquist sampling period 311 and a sub-Nyquist sampling period 321 or multiple thereof such as 321, 322 and 323. During the Nyquist sampling period 311 a sensor 121 may sample a signal according to a Nyquist sampling scheme. During a sub-Nyquist sampling period 321, 322, 323 the sensor may sample a signal according to a compressive sampling scheme, respectively. Thus, the compressive sampling schemes of each sub-Nyquist sampling period 321, 322 and 323 may be identical or different for each sub-Nyquist sampling period. According to an embodiment, the sensor 121 may alternate between using a Nyquist sampling period and a sub-Nyquist sampling period. The gateway 110 or server 130 may indicate to or request a sensor 121 to switch the sampling scheme, for example, based on a determined critical signal condition of a signal at a sensor.

In an exemplary embodiment, the sensor 121 may use a Nyquist sampling period 311 25% of the time of the composited sampling interval 301 while using sub-Nyquist sampling periods 321, 322 and 323 for 75% of the time of the composited sampling interval 301. In another exemplary embodiment, the sensor 121 may use a Nyquist sampling scheme 10% of the whole composited sampling interval while using one or more sub-Nyquist sampling scheme for the rest of the composited sampling interval, i.e. 90% of the composited sampling interval.

A specific layout of a composited sampling interval may be based on an estimated time evolution of the sparsity of a signal associated with a sensor 121. The gateway 110 or server 130 may determine the layout of a composited sampling interval and may provide said layout to the sensor 121. According to an embodiment, the gateway 110 may provide updated sub-Nyquist sampling schemes to the sensors 120. Alternatively, the sensors 120 may receive updated sub-Nyquist sampling schemes from the server 130.

According to an embodiment, the gateway 110 or server 130 may receive Nyquist sampled data from each sensor within a common or same sampling period simultaneously. Likewise, the gateway 110 or server 130 may receive Nyquist sampled data from each sensor in series.

Figure 3B:
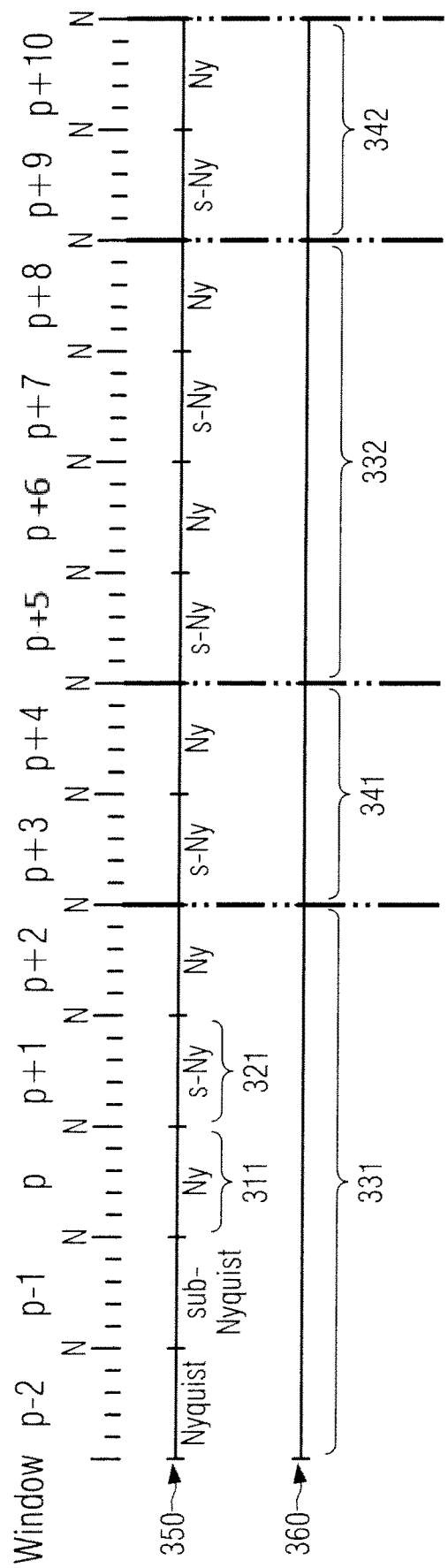
FIG. 3B illustrates a time diagram for adaption processes performed at the server 130 or gateway 110.

FIG. 3B illustrates a time diagram for adaption processes performed at the server 130 or gateway 110. A timeline 350 for the sampling periods illustrates an exemplary sampling pattern for a sensor 121. For example, the sensor 121 may alternate between Nyquist sampling period 311 and a sub-Nyquist sampling period 321. Each sampling period may have a size of N sampling time instants. A parallel timeline 360 illustrates corresponding time intervals at the gateway 110 or server 130. During a subsampling adaption window 331, which may overlap with sampling time windows (p−2) to (p+2), a subsampling adaption process may be performed at the server 130 or gateway 110. The same may hold true for subsampling adaption window 332, which may overlap with the sampling time windows (p+5) to (p+8). During a sparsifying transform adaption window 341 or 342 a sparsifying transform adaption process may be performed at the server 130 or gateway 110. As such, the sparsifying transform adaption process and subsampling adaption process may be performed in an alternating manner. The variation of the frequency components of the original signal being sampled at the sensor 121 may be used to determine a proportion or ratio between the sampling periods which may be used performing the subsampling adaption process and the sparsifying transform adaption process. This is triggered if the variation of the components between subsequent time windows surpasses a predefined threshold, e.g. the RMS variation of the components for a previous set of time windows. The ratio may be given by (number of sampling periods during subsampling adaption process)/(number of sampling periods during sparsifying transform adaption process).

Figures 4, 5A:
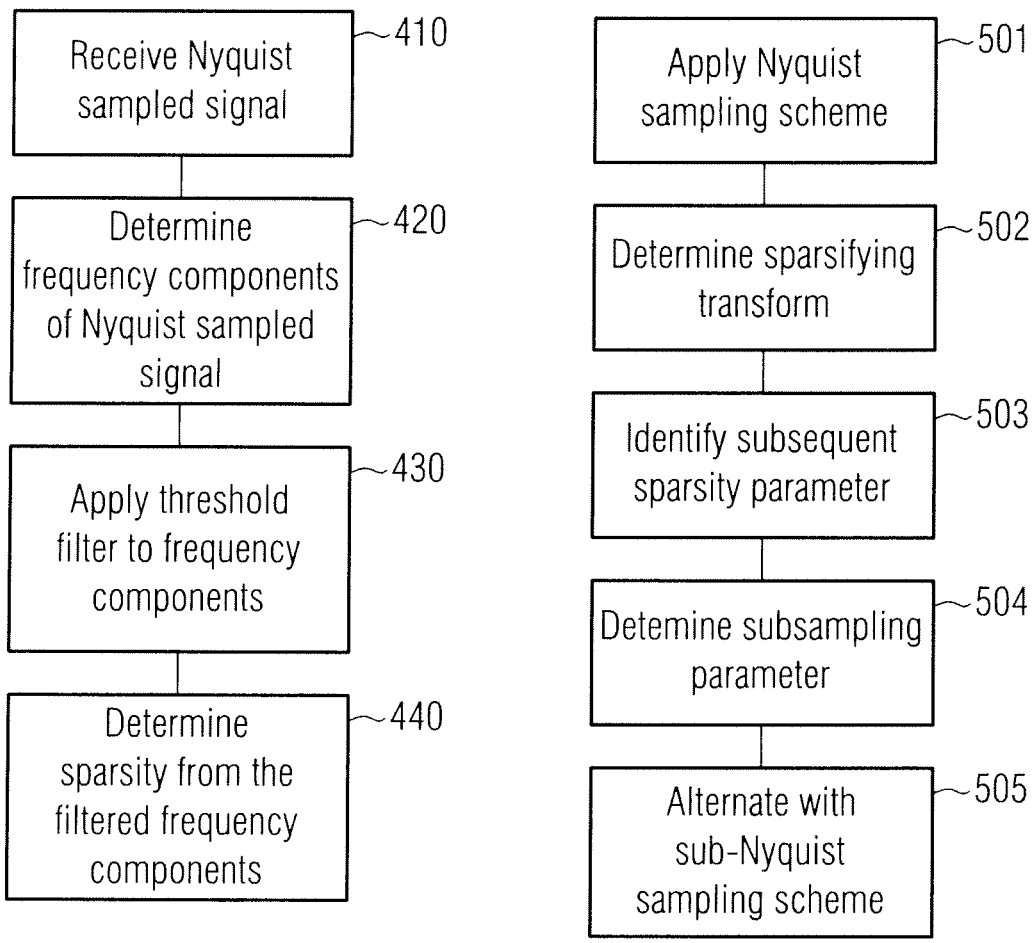
FIG. 4 is a flow diagram illustrating a method for determining a sparsity of a signal at a sensor.
FIG. 5A is a flow diagram illustrating an adaptive process for determining a sparsifying transform for a sensor.

FIG. 4 illustrates a flow diagram for determining a sparsity for a sensor 121, respectively a signal being sensed by the sensor 121. The sparsity of the signal associated with a specific sensor may be determined from a set of data sampled according to a Nyquist sampling scheme (also denoted as Nyquist sampled data). A subsampling parameter M may be further determined based on the determined sparsity. For example, the gateway 110 may apply a decomposition transform (such as an inverse transform of a DCT, DFT, PCA, STFT, Gabor transform, Hadamard transform, etc.) to the Nyquist sampled data. The subsampling and sparsifying transform matrix may then be condensed into one single matrix in one step by uniform randomly selecting m rows out of the sparsifying transform, with the same random sequence as deployed in the gateway 110.

According to an embodiment, in step 410 sensor values from a Nyquist sampling period may be received, wherein these sensor values represent a Nyquist sampled signal. In step 420 the Nyquist sampled signal may be decomposed into its frequency components based on a decomposition basis (such as a Fourier, PCA, Gabor or Hadamard basis, etc.) or dictionary. The decomposition basis or dictionary may be provided by the server 130. The server may find an optimized dictionary using machine learning algorithms. The decomposition basis or dictionary may be defined by a decomposition matrix or sparsifying matrix, which may take as a suitable input the decomposition basis or dictionary used in previous time windows. In step 430 a threshold filter may be applied to each frequency component. For example, each frequency component below a specified threshold may be rejected. Such rejection scheme may be used to separate signal components from noise or spectral leakage components in the frequency decomposition of the Nyquist sampled signal. The number of the remaining frequency components (i.e. the frequency components which are not rejected) may be the sparsity of the Nyquist sampled signal. In step 440 the sparsity for a sensor may be determined. For example, the sparsity may be determined as the number of normalized decomposition components summed up to a specific threshold value below 1. The method for determining a sparsity for a sensor may be performed by the gateway 110 or the server 130.

According to an embodiment, the subsampling parameter M (throughout the entire application the terminology "reduced number of samples" is used tantamount to "subsampling parameter") for each sensor 120 may be adapted to the actual sparsity of a sensed signal at a sensor 121. That is, according to compressive sensing theory, the sparser the signal is the lower the subsampling parameter M may be chosen, while still maintaining the ability to recover the signal. Likewise, a decrease of the sparsity of the signal (in other words, the signal becomes less sparse) may require increasing the subsampling parameter M to maintain the ability to recover the signal.

FIG. 5A illustrates an adaptive process for determining a sparsifying transform for a sensor. In step 501, the sensor 121 may apply a Nyquist sampling scheme. As such, a Nyquist sampled signal may be received or determined. In step 502, an adaptive sparsification phase, an actualized sparsifying transform may be determined, so as to adapt to the sparsification of the signal. The new sparsifying transform may be used to evaluate the new sparsity of the signal at the sensor 121. During the adaptive sparsification phase, decomposition parameters of the signal may be detected. For example, the gateway 110 or server 130 may use a CPPCA (Compressive-Projection Principal Component Analysis) method for extracting k projection coefficients. According to an embodiment, a new sparsifying transform may be set in the server 130. In step 503, an adaptive sparsity detection phase, a subsequent sparsity parameter may be identified. For example, an adaptive filtering scheme may be used for predicting a sparsity of a subsequent sampling period. In step 504, an adaptive subsampling phase, the subsampling parameter may be determined, adapted and/or actualized. In step 505, the sensor may apply a sub-Nyquist scheme interleaved during steps 502 to 504.

The subsampling actualization scheme of M may be interleaved with an approximation scheme determining the underlying optimal PCA projection coefficients of the underlying data sets. This scheme may be interleaved again with the adaptive filtering scheme or methodology determining the (normalized) sparsity at subsequent Nyquist sampling periods. According to an exemplary embodiment of the invention, such a method is described by the following steps, which can be performed in the following order:

1. Initialization: Set sparsity parameter k to the size of the data window to analyze. As an example, the CPPCA (Compressive-Projection Principal Component Analysis) method can be used during the Nyquist phase at window p as the approximation method for the projection coefficients. This is described in more details in "Compressive-Projection Principal Component Analysis" by James Fowler, retrievable from http://my-.ece.msstate.edu/faculty/fowler/Publications/Papers/Fow2009.pdf, which is incorporated herewith by reference. All N coefficients that may be required for the whole characterization may be computed and transferred to the server 130. Alternatively, the PCA procedure may be directly performed in the server 130, upon transmission of the original Nyquist sampled data. For all k=N steps, the CPPCA approximation method may be applied using random projections. A sparsifying transform may be recomposed with the recovered projection coefficients in the server 130. The single projection coefficients may be further filtered by a low pass filters to avoid unnecessary noise components in the final reconstructed signal.

2. Sub-Nyquist sampling period: The N×N sparsifying transform approximated in the server 130 may be applied to the incoming reduced vector to reconstruct the original data vectors during 90% of the time and interleaved with the Nyquist scheme during 10% of the time.

3. Adaptive filtering learning process: The steps 1 and 2 may be repeated until the deviation of the predicted and the real sparsity values registered during subsequent Nyquist sampling windows is minimal. The resulting sparsifying transform at the end of this process may be fixed for subsequent Nyquist and sub-Nyquist sampling periods until an update may be required. For example, an update may be required when dynamics of an underlying signal change notoriously (as determined by a notorious change in the projection coefficients. This may be detected at the gateway and further notified to the server).

4. Subsampling adaptation process: During a subsampling adaption window 331 the subsampling parameter M may be updated while keeping the sparsifying transform fixed, based on the predicted sparsity S(p+1). That is, during the subsequent Nyquist sampling periods only the subsampling parameter M is updated while at the same time the sparsifying transform is kept fixed. During all Nyquist phases, the predicted sparsity value S(p+1) from the previous values S(1) to S(p) may be determined both in the gateway 110 and the server 130. The subsampling parameter value may be determined beforehand by an exact prediction model M(k,N), with M the subsampling parameter, k the sparsity and N the size of the studied sampling window.

5. Sparsifying transform adaptation process: With a well defined periodicity of the Nyquist sampling period (i.e.

after the predetermined time at which the dynamics of the data change notoriously) the updated sparsity $S(p+1)=k$ may be defined as the input parameter for the CPPCA method which the gateway 110 may use to extract the projection coefficients. Only the k most important steps may be computed and the coefficients may be transmitted to the server 130. At the server 130 the k projection coefficients may be computed. The rest of the N-k coefficients may be copied from the previous PCA decomposition (they describe frequency components with the least variance in the data). Alternatively, if there are no bandwidth limitations between the server 130 and the gateway 110, a dictionary learning method may be used, which may require the transmission of the complete Nyquist sampled dataset from the server 130 to the gateway 110.

6. The gateway may use the k projection coefficients determined during the CPPCA encoding process and compare them with the k projection coefficients determined at the previous steps. An alarm may be triggered, if a significant difference between some of the entry values of the $k_i$ projection coefficients is determined. As the same coefficients and corresponding PCA transformation are synchronized in the server 130, the same information about the alarms can be shared with the server. According to an exemplary embodiment, the CPPCA method may be performed continuously over all Nyquist sampling periods in order to continuously determine changes in specific frequency ranges and, if desired by a user, to inform him about the changes.

7. The sparsifying transform is updated and the steps 3. and 4. running during the subsampling adaptation process may be repeated until the next required update in the sparsifying transform is required in order to adapt to the new data dynamics.

This concept has the advantages that the data reduction is adapted both to the data ingestion volume and the dynamical variety of data. For example, variations during high/medium/low use of machine (such as a car) may lead to changes in the dynamics of the data. Nevertheless, an optimal reconstruction quality set by the user may be maintained by the adaption process.

Another advantage is that the computational resources and the memory footprint for storing a full set of PCA components in the gateway 110 are reduced.

Another advantage is a reduction of the overall transmission bandwidth: A reduced set of projection coefficients may be transmitted from the gateway 110 to the server 130 instead of the whole Nyquist sampled data.

Another advantage is that the adaptive filtering scheme allows combining mutually exclusive schemes: Compressive sensing (CS) and CPPCA sparsifying transform estimation. The first (CS) may function under the conditions of a known sparsifying transform and unknown sparsity, whereas the second (CPPCA) may deliver a sparsifying transform from a known (such as predicted) sparsity parameter. According to an exemplary embodiment of the invention, only the server 130 may need to store a sparsifying transform.

According to an embodiment, the same adaptive filtering technique may be applied when using online streaming solutions, such as Streaming Greedy Pursuit (SGP) or Recursive Compressed Sensing (RCS) schemes. Then, instead of a reconstruction of finite length sized blocks used in the compressed sensing scheme, a reconstruction of the data points with an actualization rate given by each new sampling time may be performed and/or required. In this embodiment, the sparsity of the underlying signal may be acquired periodically at specific snapshots of the underlying finite length signal of the SGP or RCS scheme and may be used for predicting sparsities of subsequent sampling periods.

Figures 5B, 6:
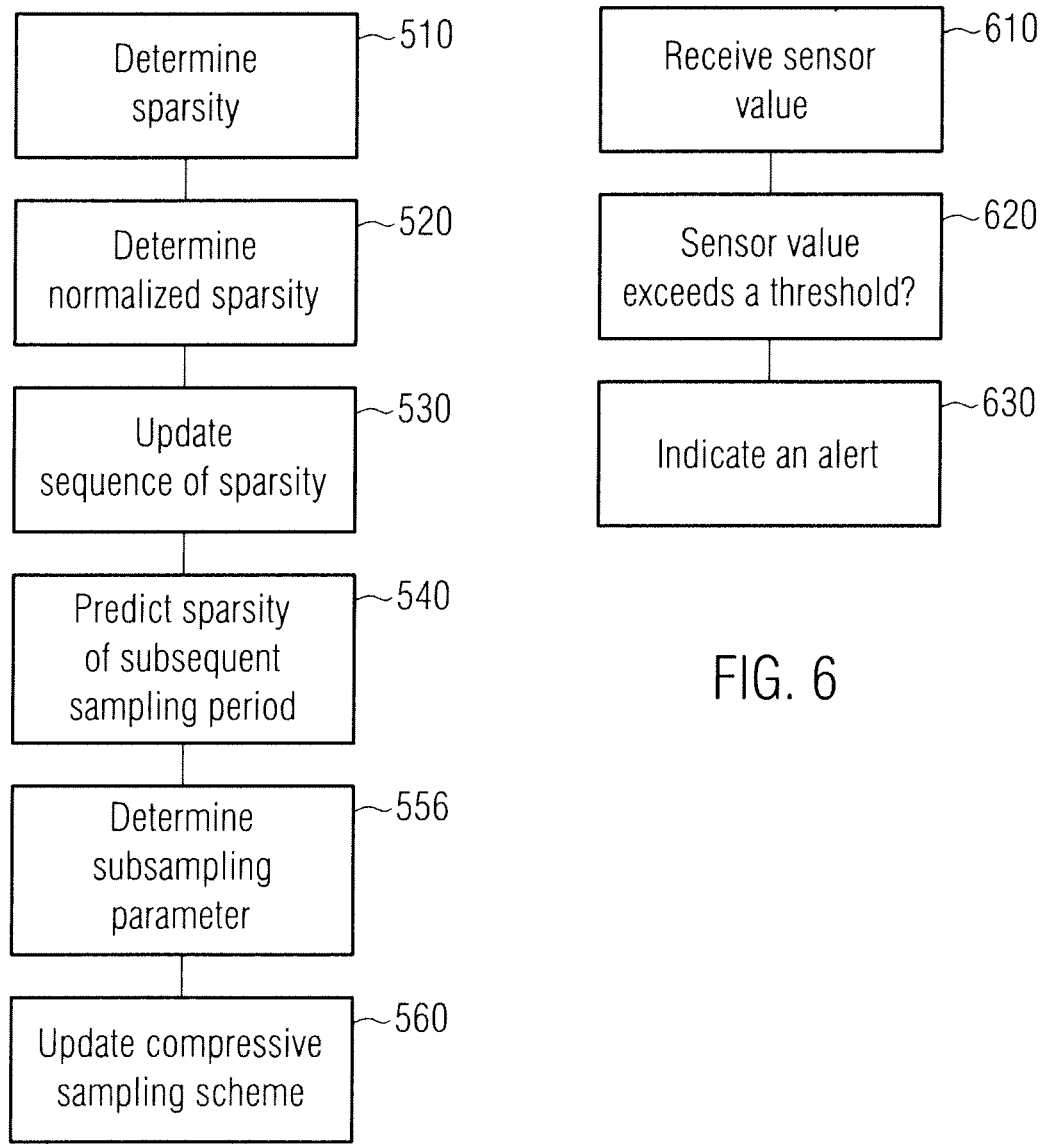
FIG. 5B is a flow diagram illustrating an adaptive process for determining a subsampling parameter for a sensor.
FIG. 6 is a flow diagram illustrating a method for determining a critical signal condition associated with a sensor.

FIG. 5B illustrates an adaptive process for updating the subsampling parameter M for each sensor. The normalized sparsity of a sensor signal may be computed, for example, by k/N, wherein k denotes the sparsity of the sensor signal and N denotes the number of samples according to a Nyquist sampling scheme. For each subsequent Nyquist sampling period p, the normalized sparsity k/N may be stored, for example in a collection or list S(p). The sparsity of a subsequent composited sampling interval may be approximated, estimated or predicted based on the stored values of normalized sparsity, for example the list S(p).

In the following a procedure for updating the subsampling parameter M for a specific sensor is explained in further detail. The procedure may also be denoted as a subsampling actualization scheme or subsampling adaption routine. In step 510 the sparsity k of a sensor signal may be determined. This determination may be based on Nyquist sampled data from a Nyquist sampling period. In step 520 the normalized sparsity of the signal may be determined. The normalized sparsity of the signal may be determined by dividing the sparsity k with the number of sampled data N within the Nyquist sampling period. In step 530 the determined normalized sparsity may be added or appended to a sequence of normalized sparsities of previous sampling periods. In step 540 the sparsity (or normalized sparsity) for a subsequent sampling period of a sensor may be predicted. For example, an adaptive filtering scheme (e.g. a Kalman filter, a linear prediction method or an adaptive linear prediction method) may be used to determine a predicted sparsity. Moreover, filtering weights of the adaptive filtering scheme may be updated according to a maximum likelihood estimation (MLE) method fed by weights determined in previous Nyquist sampling periods. In step 550 a subsampling parameter M for the subsequent sampling period may be determined. The determination of the subsampling parameter M for the subsequent sampling period may be based on a correlation model between the predicted sparsity or normalized sparsity with the subsampling parameter M. The model determining the correlation may be predetermined or trained on surrogate or previous data. The accuracy of the prediction may be validated by observing a minimal deviation between the predicted and the real sparsity as obtained during the Nyquist sampling periods. According to an embodiment, the model may also account for noise components, such as average normalized noise components or a (dynamic) noise level at a sensor 121. Likewise, the subsampling parameter M may also be determined based on heuristics or on time series analysis of the determined (normalized) sparsity.

FIG. 6 illustrates a flow diagram for determining a critical signal condition associated with a sensor 121. According to an embodiment, the gateway 110 or server 130 may perform the following method to determine the critical signal condition. In step 610, the gateway 110 may receive sampled data from the sensor 121. The received sampled data may be sampled according to a Nyquist sampling scheme or a compressive sampling scheme. Further, the received sampled data may just comprise a sensor value, for example, one sensor value corresponding to a sampling instant of a compressive sampling scheme. The gateway 110 may examine each sensor value as it is received and determine if the received sensor value satisfies a predefined condition in step 620. For example, the gateway 110 may determine if the received sensor value surpasses a specific threshold. In another example, the gateway 110 may determine if the average of the last received sensor values surpasses a specific threshold. In another example, the gateway may determine if the moving average of the last received sensor values surpasses a specific threshold. In step 630, the gateway 110 may indicate an alert once the gateway 110 determines the critical signal condition. According to an embodiment, the gateway 110 may likewise notify the corresponding sensor to adapt its sampling scheme in step 630. For example, the gateway 110 may indicate to the sensor 121 to switch from a compressive sampling scheme to a Nyquist sampling scheme.

Figure 7:
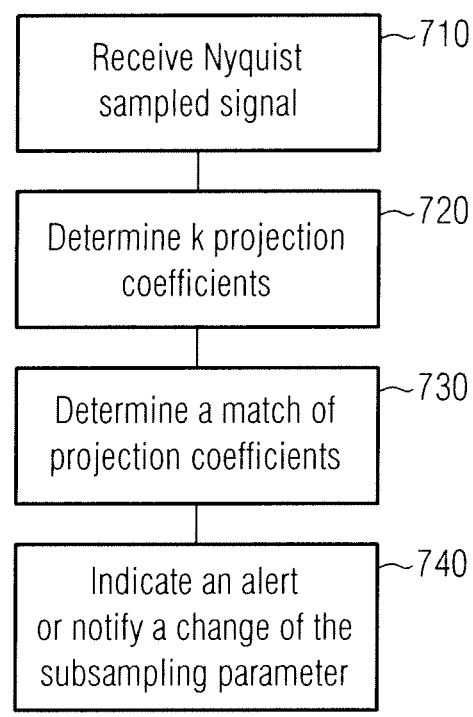
FIG. 7 is a flow diagram illustrating another method for determining a critical signal condition associated with a sensor.

FIG. 7 illustrates a flow diagram for determining a critical signal associated with a sensor, such as sensor 121. According to an embodiment, a gateway 110 or a server 130 may perform the following method to determine the critical signal condition in a frequency domain or frequency regime. Here it is required that a known sparsifying transform (as defined previously) is multiplied with the sampled signal (comprising sensor values or data points) and determining the weights of the resulting components. The gateway 110 may receive Nyquist sampled data in step 710, for example, corresponding to N sampled data points. In step 720, it may identify critical frequency components using the scheme described in the previous section. k projection coefficients may be determined by using a CPPCA. In step 730 the gateway 110 or server 130 may determine if the k projection coefficients within the sampling period matches to a frequency pattern, defined for example by the underlying projection coefficients determined during the CPPCA encoding process. Likewise, the k projection coefficients may by compared with previously determined projection coefficients of a previous sampling period. The frequency pattern may correspond to a predefined critical signal condition, if the projection coefficient differ significantly from the one at a previous Nyquist sampling period. In step 740 the gateway 110 or server 130 may then indicate an alert or likewise adapt the sampling scheme and the sparsifying transform to be used for the corresponding sensor. Likewise, a notification of a significant change of the subsampling parameter may be given, for example, to a client or user.

Figure 8:
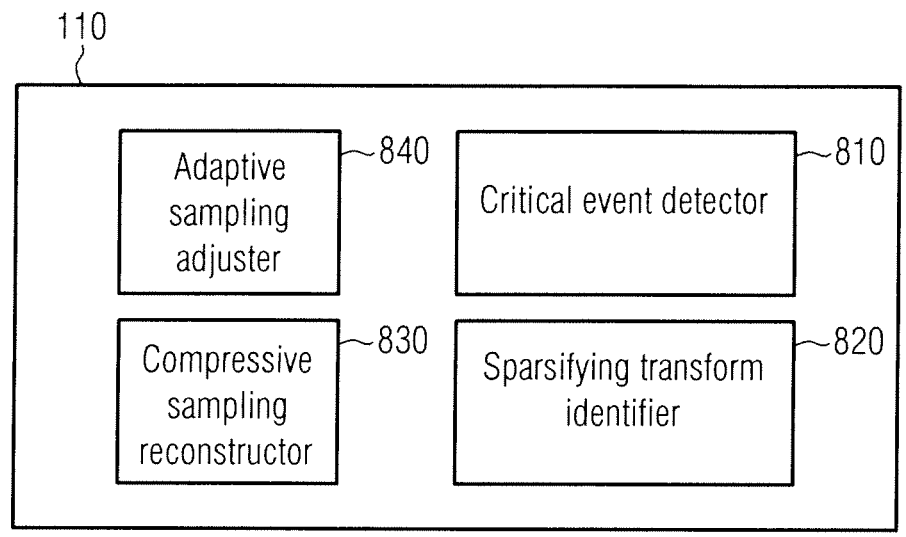
FIG. 8 is a block diagram illustrating the components of the gateway.

FIG. 8 illustrates a block diagram of the components of the gateway 110. According to an embodiment, the gateway 110 may include a critical event detector 810. Said critical event detector 810 may be used to determine critical signal conditions based on the received sub-Nyquist sampled data before performing a recovery of the original signal based on the sub-Nyquist sampled data. According to an embodiment, the gateway 110 further includes a sparsifying transform identifier 820, which may be used to determine critical signal conditions based on above discussed embodiments. The sparsifying transform identifier 820 may be used to identify predefined frequency components of the signal. According to an embodiment, the gateway 110 further comprises a compressive sensing reconstruction component 830. Said compressive sensing reconstruction component 830 may be used to recover the original signal from the sub-Nyquist sampled data. According to an embodiment, the gateway 110 further comprises an adaptive sampling adjusting component 840, which may be used to adapt the sub-sampling parameter M of a corresponding compressive sampling scheme of a sensor (for a subsequent sampling period).

According to an embodiment, the gateway 110 or server 130 may reconstruction methods for sensor data, prior synchronization of the sparsifying transform between the gateway and the server. For example, the gateway 110 or server 130 may use a reconstruction method based on a soft thresholding based greedy reconstruction method, using only the k reconstruction steps set by the predicted sparsity for a decomposition of the signals in the underlying sparsifying transform. Only the projection components may further be transferred to the server, where they may be used to recover the original signal after multiplication with the corresponding sparsifying transform.

Figure 9:
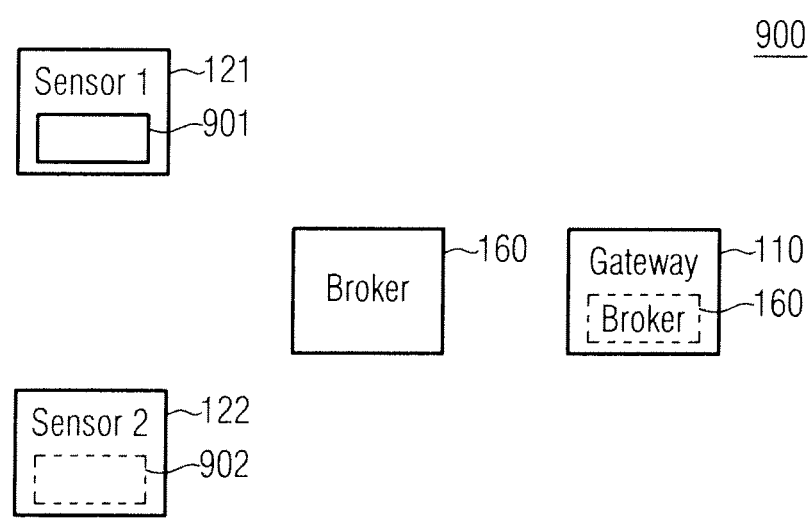
FIG. 9 is a block diagram illustrating a system of a gateway, sensors and a message broker.

FIG. 9 illustrates a system 900 comprising a gateway 110, a first sensor 121, a second sensor 122 and optionally a message broker 160 which may likewise be a component of the gateway 110. The message broker 160 may be an MQTT broker. According to an embodiment, the sensor 121 may subscribe to a topic of sampling schemes at the message broker 160. The gateway 110 may publish sampling schemes for each different sensor 121 and 122 to the message broker 160. For example, the gateway 110 may publish a first sub-Nyquist sampling scheme for the first sensor 121 and a second sub-Nyquist sampling scheme for the second sensor 122. These two sub-Nyquist sampling schemes may be made such that the sensors 121 and 122 transmit their sampled data to the gateway 110 in a multiplexed manner during a common sampling period. This allows reducing the data traffic at the gateway 110. According to another example, the sensors 121 and 122 may publish their sampled data to the message broker 160. In this example, the gateway 110 may subscribe to a topic of sampled data of each sensor at the message broker 160. According to an embodiment, the message broker 160 may buffer the sensor values from each respective sensor 120 in case the gateway 110 is unreachable.

According to an embodiment, the multiplexed sampling scheme may be embedded into an application layer using a communication protocol like MQTT, HTTP, HTTPS or CoAP. Likewise, the multiplexed sampling scheme may also be implemented as an application layer of one's own.

Figure 10:
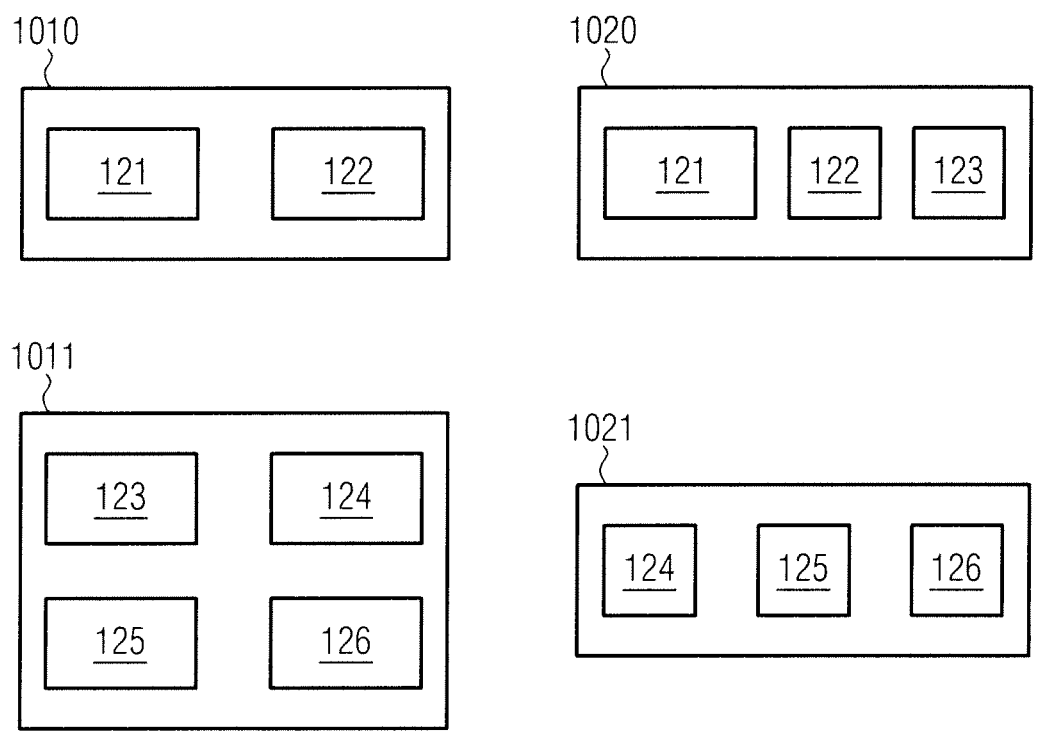
FIG. 10 is a diagram illustrating dynamically groping multiple sensors to share a common resource of the gateway.

FIG. 10 illustrates a diagram of dynamically groping multiple sensors to share a first common resource of the gateway 110 using a multiplexed sampling scheme. In the diagram, sensors 121 and 122 may share a common sampling period 1010, sensors 123 to 126 may share a second common sampling period 1011. According to an embodiment, the gateway 110 may have two resources which are shared among the plurality of sensors 121 to 126. In an example, the sensor signal of sensor 121 is sparse. Likewise, the sensor signal of sensor 122 is similarly sparse as that of sensor 121. In an initial common sampling period 1010 the sensors 121 and 122 may share the first resource of the gateway 110 by using a multiplexed sampling scheme. Accordingly, the sensor signals of the sensors 123 to 126 may also be sparse such that these sensors may share the second resource of the gateway 110 by also using a multiplexed sampling scheme for a second common sampling period 1011. The gateway 110, server 130 or cloud environment 140 may analyze the received sensor data of each sensor 121 to 126. The gateway 110 may determine or predict the sparsity of each of the signals of the sensors 121 to 126. Based on the new determined sparsity of a signal of a specific sensor an adapted (multiplexed) sampling scheme may be used to account for the change of the sparsity in each of the sensor's signals. For example, the gateway 110 may determine that the signals of sensors 121 and 122 are such sparse that the shared first resource of the gateway 110 may also be shared by 3 sensors instead of just 2 sensors. Further in this example, the gateway 110 may also determine that the signal of sensor 123 is less sparse, which in other words means that more data may be necessary to recover the original signal of sensor 123 from the sub-Nyquist sampled data. In this case, the gateway 110 may update the multiplexed sampling scheme for all sensors 121 to 126 for the subsequent sampling periods. In the next sampling period 1020, sensors 121 to 123 may share a first resource of the gateway 110. Accordingly, sensors 124 to 126 may share the second resource of the gateway 110 in the common sampling period 1021.

Further, according to an embodiment, the grouping of a set of sensors into a common time-multiplexed sampling period may be performed based on analyzing the distribution of the subsampling parameter for each sensor. For example, when the distribution of the subsampling parameter M (or correspondingly sparsity distribution) for a set of sensors lies within a 1-sigma deviation of the normal distribution of the whole set of sensors, then the set of sensors having a common subsampling parameter M (sparsity parameter k) within the 1-sigma deviation may be matched so as to apply the time multiplexed sampling scheme for a common sampling period.

The invention claimed is:

1. A computer-executable method for adaptively determining a sampling scheme applied at a first sensor from among a plurality of sensors for sampling sensor data values corresponding to a signal, the method comprising:
   predicting a sparsifying transform for a subsequent sampling time window of the first sensor, wherein the sparsifying transform is determined based on a predictive model of a sparsity of the signal;
   determining a subsampling parameter for the subsequent sampling time window, the subsampling parameter corresponding to a number of sensor data values to acquire within a sampling time window, wherein said subsampling parameter is determined based on the predicted sparsifying transform;
   determining a compressive sampling scheme for the subsequent sampling time window of the first sensor, wherein the compressive sampling scheme is determined based on the predicted sparsifying transform; and
   determining a critical signal condition associated with the first sensor, wherein said determining comprises:
      approximating a frequency decomposition of the signal sampled by the first sensor based on the received sensor data associated with the first sensor, wherein said approximating is further based on a sparsity and a sparsifying transform associated with the first compressive sampling scheme,
      comparing the approximated frequency decomposition with a predefined frequency decomposition, and
      determining that the critical signal condition is fulfilled if the approximated frequency decomposition matches the predefined frequency decomposition.

2. The computer-executable method of claim 1, the method further comprising:
   predicting the sparsity of the signal for the subsequent sampling time window using received sensor data sampled according to a Nyquist sampling scheme;
   said predicting said sparsifying transform further comprising:
   computing the sparsifying transform for the subsequent sampling time window using the predicted sparsity for the subsequent sampling time window.

3. The computer-executable method of claim 1, further comprising:
   determining a noise level associated with the first sensor using received sensor data values from the first sensor, wherein said determining of the compressive sampling scheme is further based on the determined noise level.

4. The computer-executable method of claim 1, the method further comprising:
   providing sensor data from a plurality of sensors via a network, wherein the sensor data comprises sensor data values being sampled by at least the first sensor and a second sensor from among the plurality of sensors, the sampled sensor data of the first sensor and of the second sensor being transmitted via the network according to a time multiplexing transmission scheme;
   determining a first compressive sampling scheme for the first sensor, wherein the first compressive sampling scheme defines a first set of time instants for the sensor data sampled by the first sensor;
   determining a second compressive sampling scheme for the second sensor, wherein the second compressive sampling scheme defines a second set of time instants for the sensor data sampled by the second sensor,
      wherein the first set of time instants and the second set of time instants define time instants within a common sampling time window, and
      wherein first compressive sampling scheme and the second compressive sampling scheme are non-overlapping in that the time instants of the first set of time instants are different time instants than the time instants of the second set of time instants;
   receiving sensor data comprising sampled sensor data of the first sensor and the second sensors; and
   associating each of the received sensor data values with the first sensor or with the second sensor, respectively, based on the determined first compressive sampling scheme and the determined second compressive sampling scheme.

5. The computer-executable method of claim 1, further comprising:
   updating the first compressive sampling scheme based on received sensor data of the first sensor, wherein at least part of the received sensor data of the first sensor represents sensor data sampled by the first sensor according to a Nyquist sampling scheme.

6. The computer-executable method of claim 1, further comprising:
   determining a critical signal condition associated with the first sensor, wherein said determining comprises:
      comparing the received sensor data associated with the first sensor with a given threshold, and
      determining that the critical signal condition is fulfilled if at least one of the received sensor data values associated with the first sensor exceeds the given threshold.

7. The computer-executable method of claim 1, further comprising at least one of:
   receiving an indication of the given threshold or the predefined frequency decomposition from a server within the network;
   generating an alert signal if it is determined that the critical signal condition is fulfilled; and
   updating the first compressive sampling scheme if it is determined that the critical signal condition is fulfilled.

8. The computer-executable method of claim 1, wherein the received sensor data associated with the first sensor comprises sensor data sampled by the first sensor in at least one sampling time window according to the first compressive sampling scheme and comprises sensor data sampled by the first sensor in at least one other sampling time window according to a Nyquist sampling scheme, the method further comprising:

sending the received sensor data associated with the first sensor to a server; and receiving an indication from the server indicating to omit the transmission of sensor data associated with the first sensor that was sampled by the first sensor according to the Nyquist sampling scheme.

9. The computer-executable method of claim 8, wherein a predicted sparsity of the signal sampled by the first sensor is determined by the server based on the sensor data associated with the first sensor that is sent to the server, the method further comprising:

determining, by the server, the indication based on the determined predicted sparsity of the signal sampled by the first sensor.

10. The computer-executable method of claim 1, wherein the receiving of said sensor data is performed on an application layer level according to a communication protocol.

11. A device for adaptively determining a sampling scheme applied at a first sensor from among a plurality of sensors for sampling sensor data values corresponding to a signal, the device being adapted to:

predict a sparsifying transform for a subsequent sampling time window of the first sensor, wherein the sparsifying transform is determined based on a predictive model of a sparsity of the signal;

determine a subsampling parameter for the subsequent sampling time window, the subsampling parameter corresponding to a number of sensor data values to acquire within a sampling time window, wherein said subsampling parameter is determined based on the predicted sparsifying transform;

determine a compressive sampling scheme for the subsequent sampling time window of the first sensor, wherein the compressive sampling scheme is determined based on the predicted sparsifying transform; and determine a critical signal condition associated with the first sensor by:

approximating a frequency decomposition of the signal sampled by the first sensor based on the received sensor data associated with the first sensor, wherein said approximating is further based on a sparsity and a sparsifying transform associated with the first compressive sampling scheme, and comparing the approximated frequency decomposition with a predefined frequency decomposition, and determining that the critical signal condition is fulfilled if the approximated frequency decomposition matches the predefined frequency decomposition.

12. The device of claim 11, wherein the device is a gateway or server.

13. The device of claim 11 being further adapted to:

receive sensor data from a plurality of sensors via a network, wherein the sensor data comprises sensor data sampled by at least a first sensor and a second sensor from among the plurality of sensors, the sampled sensor data of the first sensor and of the second sensor received via the network according to a time multiplexing transmission scheme determine a first compressive sampling scheme for the first sensor, wherein the first compressive sampling scheme defines a first set of time instants for the sensor data sampled by the first sensor;

determine a second compressive sampling scheme for the second sensor, wherein the second compressive sampling scheme defines a second set of time instants for the sensor data sampled by the second sensor, wherein the first set of time instants and the second set of time instants define time instants within a common sampling time window, and wherein first compressive sampling scheme and the second compressive sampling scheme are non-overlapping in that the time instants of the first set of time instants are different time instants than the time instants of the second set of time instants; and the device being adapted to associate each of the received sensor data values with the first sensor or with the second sensor, respectively, based on the determined first compressive sampling scheme and the determined second compressive sampling scheme.

14. The device of claim 11, wherein the device is further adapted to update the first compressive sampling scheme based on received sensor data of the first sensor, wherein at least part of the received sensor data of the first sensor represents sensor data sampled by the first sensor according to a Nyquist sampling scheme.

15. The device of claim 11, wherein the device is further adapted to determine a critical signal condition associated with the first sensor by:

comparing the received sensor data associated with the first sensor with a given threshold, and determining that the critical signal condition is fulfilled if at least one of the received sensor data values associated with the first sensor exceeds the given threshold.

* * * * *